United States Patent [19]
Johnson

[11] Patent Number: 5,940,422
[45] Date of Patent: *Aug. 17, 1999

[54] LASER WITH AN IMPROVED MODE CONTROL

[75] Inventor: Ralph H. Johnson, Murphy, Tex.

[73] Assignee: Honeywell Inc., Minneapolis, Minn.

[ * ] Notice: This patent issued on a continued prosecution application filed under 37 CFR 1.53(d), and is subject to the twenty year patent term provisions of 35 U.S.C. 154(a)(2).

[21] Appl. No.: 08/674,230

[22] Filed: Jun. 28, 1996

[51] Int. Cl.$^6$ .................................................. H01S 3/19
[52] U.S. Cl. ............................. 372/45; 372/46; 372/92; 372/96
[58] Field of Search ........................... 372/45, 108, 96, 372/50, 98, 97

[56] References Cited

U.S. PATENT DOCUMENTS

| 4,749,255 | 6/1988 | Chakrabarti et al. | 372/45 |
| 5,031,187 | 7/1991 | Orenstein et al. | 372/50 |
| 5,052,016 | 9/1991 | Magbobzadeh et al. | 372/96 |
| 5,115,442 | 5/1992 | Lee et al. | 372/45 |
| 5,164,949 | 11/1992 | Ackley et al. | 372/45 |
| 5,237,581 | 8/1993 | Asada et al. | 372/45 |
| 5,245,622 | 9/1993 | Jewell et al. | 372/45 |
| 5,258,990 | 11/1993 | Olbright et al. | 372/46 |
| 5,331,654 | 7/1994 | Jewell et al. | 372/45 |
| 5,351,256 | 9/1994 | Schneider et al. | 372/45 |
| 5,359,447 | 10/1994 | Hahn et al. | 359/154 |
| 5,492,607 | 2/1996 | Yap | 204/192.34 |
| 5,493,577 | 2/1996 | Choquette et al. | 372/45 |
| 5,537,666 | 7/1996 | Mori et al. | 372/96 |
| 5,557,627 | 9/1996 | Schneider, Jr. et al. | 372/50 |
| 5,574,738 | 11/1996 | Morgan | 372/96 |

FOREIGN PATENT DOCUMENTS

| 0094689 | 4/1989 | Japan | 372/96 |
| 406077582 | 3/1994 | Japan | 372/96 |

OTHER PUBLICATIONS

Article titled "Transverse Mode Control of Vertical –Cavity Top Surface. Emitting Lasers" by Morgan et al., Apr. 1993.
Article titled 200 °C, 96–nm Wavelength Range, Continuous–Wave Lasing from Unbonded GAAS MOUPE–Grown Vertical Surface Emitting Laser by Morgan et al., Oct. 1995.
Article Titled Surface Emitting Microlasers for Photonic Switching and Interchip Connections by Jewell et al., Mar. 1990.
Article Titled "Services for Optical Processing" by Morgan et al., Jul. 1991.

*Primary Examiner*—Rodney Bovernick
*Assistant Examiner*—Ellen E. Kang
*Attorney, Agent, or Firm*—William D. Lanyi; Roland W. Norris; John G. Shudy

[57] ABSTRACT

A vertical cavity surface emitting laser is provided with a mode control structure that selectively encourages or inhibits the lasing of the laser in regions of the mode control structure. Light is encouraged to lase and emit light through first portions of the mode control structure while lasing is inhibited in second portions. The first and second portions of the mode control structure are patterned by providing different thicknesses for the first and second portions of the mode control structure.

29 Claims, 14 Drawing Sheets

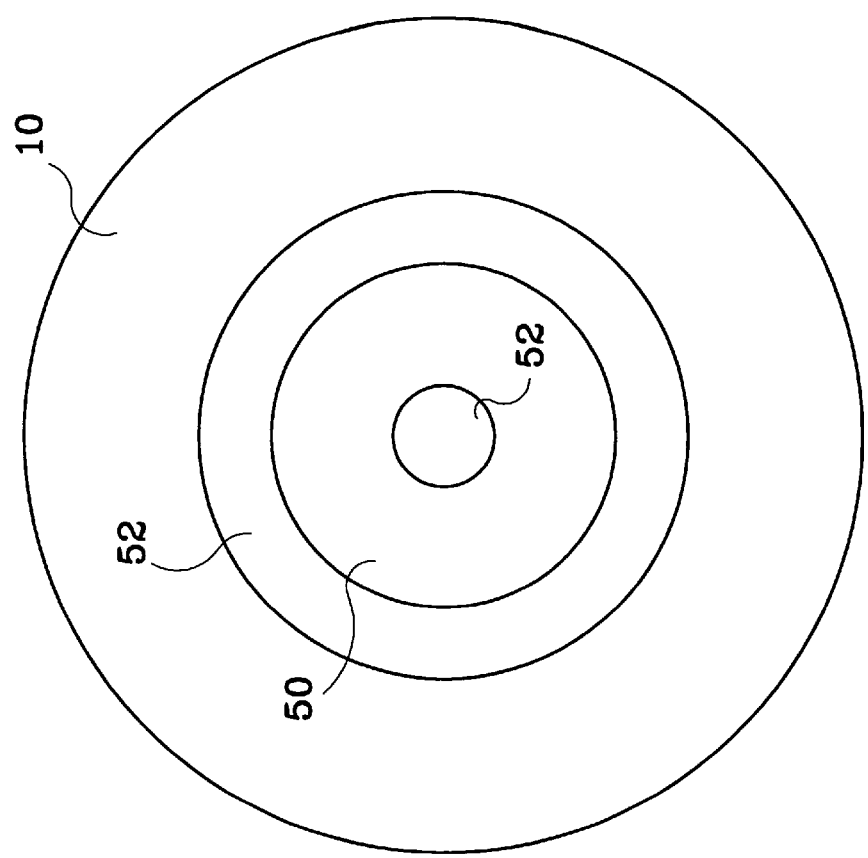
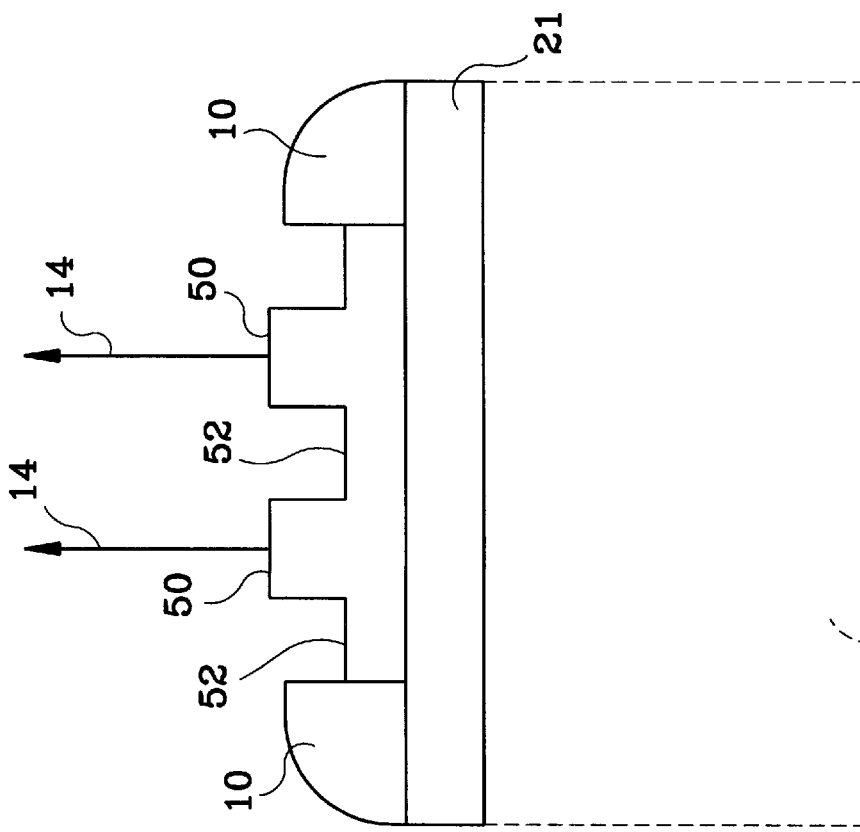
Fig. 3
Fig. 2

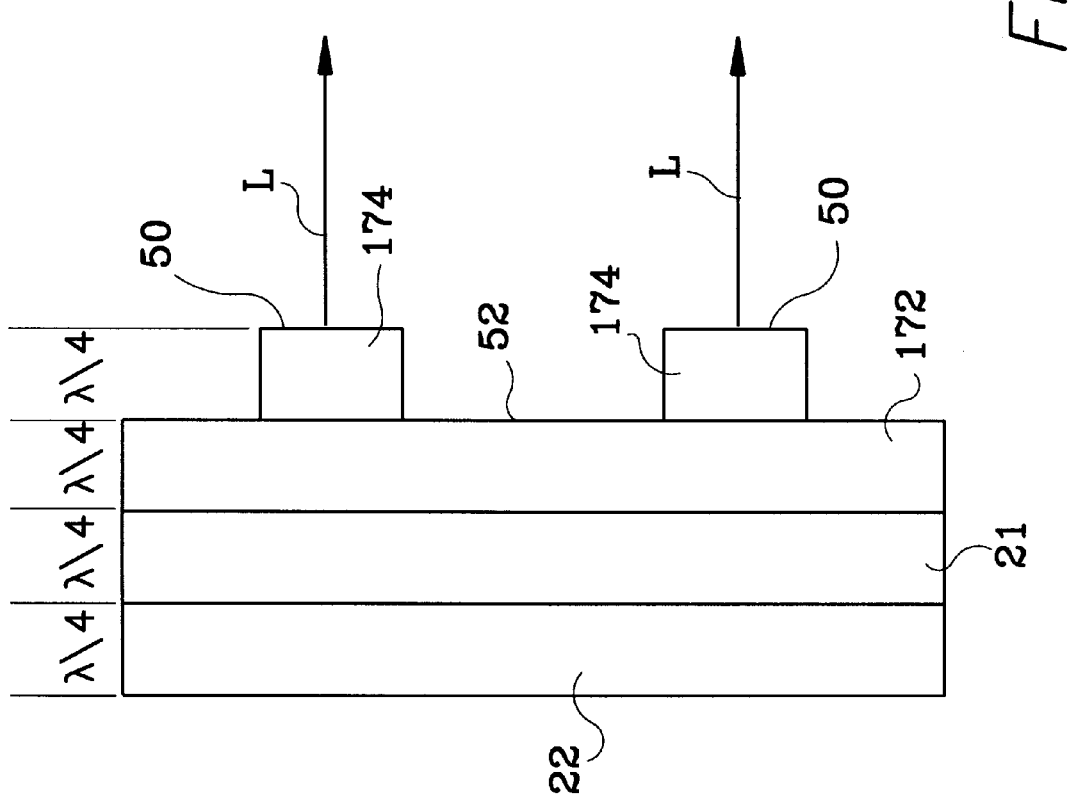

LASER WITH AN IMPROVED MODE CONTROL

BACKGROUND OF THE INVENTION

1. Field of the Invention

The present invention relates generally to a laser which comprises a mode control structure and, more particularly, to a vertical cavity surface emitting laser that is provided with an internal structure proximate one of its mirror structures that comprises different thicknesses that result in selective lasing locations by the laser.

2. Description of the Prior Art

Vertical cavity surface emitting lasers are well known to those skilled in the art. In IEEE Photonics Technology Letters, volume 4, no. 4 (April 1993), an article titled "Transverse Mode Control of Vertical-Cavity Top-Surface-Emitting Lasers" by Morgan, Guth, Focht, Asom, Kojima, Rogers and Callis discusses transverse mode characteristics and the control for vertical cavity top surface emitting lasers. It also describes a spatial filtering concept for the control of VCSEL transverse modes allowing the achievement of over 1.5 mW single TEM transverse mode emission from continuous wave electrically excited VCSEL's. It also shows that, without spatial filtering, L-I and V-I kinks can be observed.

In IEEE Photonics Technology Letters, Volume 7, No. 5 (May 1995), an article entitled "200° C., 96-nm Wavelength Range, Continuous-Wave Lasing from Unbonded GaAs MOVPE-Grown Vertical Surface-Emitting Lasers" by Morgan, Hibb-Brenner, Marta, Walterson, Bounnak, Kalweit and Lehman describes record temperature and wavelength range that was attained through the use of MOVPE-grown AlGaAs vertical cavity surface-emitting lasers. Unbonded continuous-wave lasing is achieved at temperatures up to 200° C. from these top-emitting VCSEL's and operation over 96-nm wavelength regime near 850 nm is also achieved from the same nominal design. Temperature and wavelength insensitive operation is also demonstrated in this article and the threshold current is controlled to within a factor of 2 (2.5–5 mA) for a wavelength range exceeding 50 nm and to within 30 percent (5–10 mA) for a temperature range of 190° C. at 870 nm.

In an article titled "Surface-emitting Microlasers for Photonic Switching and Interchip Connections", published in Optical Engineering, March 1990, Volume 29 No. 3 by Jewell, Scherer, McCall, Olsson, Harbison and Florez describes vertical cavity electrically pumped surface emitting microlasers which are formed on gallium arsenide substrates at densities greater than two million per square centimeter. Two wafers were grown with indium gallium arsenide active material composing three quantum wells, 80 angstroms thick, in one and a single quantum well 100 angstroms thick in the other. Lasing was seen in devices as small as 1.5 micrometers diameter with less than 0.05 micrometers cube active material. Single quantum well microlasers 5×5 micrometer square had room temperature current thresholds as low as 1.5 milliampere with 983 nanometers output wavelength. Ten-by-ten micrometer square single quantum well microlasers were modulated by a pseudorandom bit generator at one Gb/s with less than $10^{-10}$ bit error rate. Pulsed output >170 milliwatt was obtained from a 100 micrometer square device. The laser output passes through a nominally transparent substrate and out of its back side, a configuration well suited for micro optic integration and photonic switching and interchip connections.

In SPIE (Society of Photo-Optical Instrumentation Engineers) Volume 1562 (1991), an article titled "Devices for Optical processing" by Morgan, Chirovsky, Focht, Guth, Asom, Leibenguth, Robinson, Lee and Jewell reports on batch processed, totally planar, vertical cavity top surface emitting gallium arsenide/aluminum gallium arsenide laser devices and arrays. Different size devices are studied experimentally. The article describes the measurement of continuous wave threshold currents as low as 1.7 milliamperes and output powers greater than 3.7 milliwatts at room temperature. The article also discusses interesting characteristics such as differential quantum efficiencies exceeding unity and multitransfers mode behavior. An array having a 64 by 1 individually accessed elements is characterized and shown to have uniform room temperature continuous wave operating characteristics in threshold currents approximately equal to 2.1 milliamperes with a wavelength of approximately 849.4 nanometers and an output power of approximately 0.5 milliwatts.

U.S. Pat. No. 5,331,654, which issued to Jewell et al on Jul. 19, 1994, discloses a polarized surface emitting laser. It describes a vertical cavity surface emitting semiconductor diode laser having a monolithic and planar surface and having lateral anisotropy in order to control the polarization of the emitted light beam. The diode laser includes a body of a semiconductor material having an active region therein which is adapted to generate radiation and emit the radiation from a surface of the body, and a separate reflecting mirror at opposite sides of the active region with at least one of the mirrors being partially transparent to the generated light to allow the light generated in the active region to be emitted therethrough. The anisotropy may be provided by utilizing anisotropy in the atomic or molecular structure of the materials forming the laser or by anisotropic patterning or deliberate offset alignment in processing of the laser or through anisotropic structures in the laser cavity to control the polarization of the emitted beam. U.S. Pat. No. 5,331,654 is hereby explicitly incorporated by reference.

U.S. Pat. No. 5,351,256, which issued to Schneider et al on Sep. 27, 1994, describes an electrically injected visible vertical cavity surface emitting laser diode. Visible laser light output from an electrically injected vertical cavity surface emitting laser diode is enabled by the addition of phase matching spacer layers on either side of the active region to form the optical cavity. The spacer layers comprise indium aluminum phosphide which act as charge carrier confinement means. Distributed Bragg reflector layers are formed on either side of the optical cavity to act as mirrors. U.S. Pat. No. 5,351,256 is hereby explicitly incorporated by reference.

U.S. Pat. No. 5,031,187, which issued to Orenstein et al on Jul. 9, 1991, discloses a planar array of vertical cavities surface emitting lasers. The device comprises an active region having a quantum well region disposed between two Bragg reflector mirrors separated by a wavelength of the emitting laser. A large area of the structure is grown on a substrate and then laterally defined by implanting conducting reducing ions into the upper mirror in areas around the lasers. Thereby, the laterally defined laser array remains planar. Such an array can be made matrix addressable by growing the structure on a conducting layer overlying an insulating substrate. After growth of the vertical structure, an etch or further implantation divides the conducting layer into strips forming bottom column electrodes. Top row electrodes are deposited in the perpendicular direction over the laterally defined top mirror. U.S. Pat. No. 5,013,187 is hereby explicitly incorporated by reference.

U.S. Pat. No. 5,245,622, which issued to Jewell et al on Sep. 14, 1993, describes a vertical cavity surface emitting laser with intra-cavity structures. The intra-cavity structures allow the vertical cavity surface emitting laser to achieve low series resistance, high power efficiencies and $TEM_{00}$ mode radiation. In one embodiment of the invention, a VCSEL comprises a laser cavity disposed between an upper and a lower mirror. The laser cavity comprises upper and lower spacer layers sandwiching an active region. A stratified electrode for conducting electrical current to the active region is disposed between the upper mirror and the upper spacer. The stratified electrode comprises a plurality of alternating high and low doped layers for achieving low series resistance without increasing the optical absorption. The VCSEL further comprises a current aperture as a disc shaped region formed in the stratified electrode for surpressing higher mode radiation. The current aperture is formed by reducing or eliminating the conductivity of the annular surrounding regions. In another embodiment, a metal contact layer having an optical aperture is formed within the upper mirror of the VCSEL. The optical aperture blocks the optical field in such a manner that it eliminates higher transverse mode lasing. U.S. Pat. No. 5,245,622 is hereby explicitly incorporated by reference.

U.S. Pat. No. 5,359,447, which issued to Hahn et al on Oct. 25, 1994, discloses an optical communication with vertical cavity surface emitting laser operating in multiple transverse modes. The communication system uses a relatively large area of vertical cavity surface emitting laser. The laser has an opening larger than approximately 8 micrometers and is coupled to a multimode optical fiber. The laser is driven into multiple transverse mode operation, which includes multiple filamentation as well as operation in a single cavity. U.S. Pat. No. 5,359,447 is hereby explicitly incorporated by reference.

U.S. Pat. No. 5,237,581, which issued to Asada et al on Aug. 17, 1993, describes a semiconductor multilayer reflector and a light emitting device. The reflector includes a plurality of first quarter wavelength layers each having a high refractive index, a plurality of second quarter wavelength layers each having a low refractive index and high concentration impurity doping regions. The first and second layers are piled up alternately and each of the doping regions is formed at a heterointerface between the first and second layers. In this structure, the width and height of the potential barrier at the heterointerface becomes small so that tunnel current flowing through the multilayer reflector is increased. U.S. Pat. No. 5,237,581 is hereby explicitly incorporated by reference.

U.S. Pat. No. 5,115,442, which issued to Lee et al on May 19, 1992, discloses a top emitting surface emitting laser structure. Lasers of this type depend upon emission through apertured top surface electrodes. Biasing current, accordingly peripheral to the laser is introduced, follows the path which comes to confluent within the active region to effectively attain lasing threshold. The path is the consequence of a buried region of increasing resistance which encircles the laser at or above the active region. The buried region is produced by ion implantation-induced damage with ion energy magnitude and spectrum chosen to produce an appropriate resistance gradient integrated, as well as discrete, laser are contemplated by the patent. U.S. Pat. No. 5,115,442 is hereby explicitly incorporated by reference.

U.S. Pat. No. 5,258,990, which issued to Olbright et al on Nov. 2, 1993, describes a visible light surface emitting semiconductor laser. The laser comprises a laser cavity sandwiched between two distributed Bragg reflectors. The laser cavity comprises a pair of spacer layers surrounding one or more active, optically emitting quantum well layers having a bandgap in the visible range which serves as the active optically emitting material of the device. The thickness of the laser cavity is defined as an integer multiplied by the wavelength and divided by twice the effective index of refraction of the cavity. Electrical pumping of the laser is achieved by heavily doping the bottom mirror and substrate to one conductivity type and heavily doping regions of the upper mirror with the opposite conductivity type to form a diode structure and applying a suitable voltage to the diode structure. Special embodiments of the invention for generating red, green and blue radiation are also described in this patent. U.S. Pat. No. 5,258,990 is hereby explicitly incorporated by reference.

SUMMARY OF THE INVENTION

As is well known to those skilled in the art, the output modes of a laser can either positively or negatively affect its use in signal transmission applications. The mode structure is important because different modes can couple differently to an optical fiber. In addition, different modes may not have the same threshold current. Different modes can also exhibit different rise and fall times. Variation in threshold current, which can be caused by different modes, combined with the different coupling efficiencies of the different modes can cause the coupling into an optical fiber to vary in a highly nonlinear manner with respect to current. The variable coupling to an optical fiber, combined with the different rise and fall times of the various modes, can cause signal pulse shapes to vary depending on the particular characteristics of the coupling. It would therefore be beneficial if a laser could be provided with a mode control structure that enables selected modes to be output from the laser. When the present invention is incorporated in a vertical cavity surface emitting laser, the laser comprises a first mirror stack and a second mirror stack, with the first mirror stack and second mirror stack comprising first and second pluralities of layers of alternating refractive indices, respectively. An active region of the laser is disposed between the first and second mirror stacks. The first mirror stack, second mirror stack and active region of the laser are selected to cause the laser to emit light of a preselected wavelength. As is generally known to those skilled in the art, the materials selected for the various layers of the laser will determine, in combination with the thicknesses of the layers, the wavelength of light emitted from the laser. A laser made in accordance with the present invention also comprises a mode control structure that is shaped to cause the laser to emit light through one or more preselected first portions of the mode control structure and to inhibit emission of light through second portions of the mode control structure. In a particularly preferred embodiment of the present invention, the first portions of the mode control structure have a thickness generally equal to a half of the preselected wavelength of the laser. The second portions of the mode control structure have a thickness generally equal to a quarter of the preselected wavelength.

In certain embodiments of the present invention, the mode control structure can comprise silicon nitride or silicon dioxide and a metallic contact layer can be disposed in partially overlapping association with the mode control structure. The mode control structure can be a final layer of an upper mirror that is disposed near the metallic contact layer at the end of the laser from which the light is emitted. The first and second portions of the mode control structure are determined by their thicknesses which are chosen to result in a preselected pattern of lasing regions and nonlasing regions. The first and second portions of the mode control structure can either comprise the same material or different materials. The first portion of the mode control structure, in a particularly preferred embodiment of the present invention, is radially symmetric with respect to a center of the mode control structure. The first and second portions of the mode control structure can comprise materials of different refractive indices.

In certain embodiments of the present invention, a coating is disposed over the first and second portions of the mode control structure and the coating can be a thickness that is generally equal to a quarter of the preselected wavelength of the laser. The coating can comprise silicon nitride and the first portion of the mode control structure can comprise silicon dioxide.

In a typical application of the present invention, the laser can further comprise a first confinement layer and a second confinement layer, the active region being disposed between the first and second confinement layers and the first and second confinement layers being disposed between the first and second mirror stacks. In addition, the laser can comprise a substrate, with the first and second mirror stacks being disposed between the substrate and the metallic contact layer.

By providing the mode control structure which causes the laser to lase in preferred regions of its cross sectional dimension and not lase in other regions of its cross sectional dimension, the present invention makes it possible for the laser to emit light in preselected modal patterns. The first portions of the mode control structure, through which light is emitted, can be patterned in virtually any shape to create the pattern of light output regions that is most desirable for a particular application.

BRIEF DESCRIPTION OF THE DRAWINGS

The present invention will be more fully and completely understood from a reading of the Description of the Preferred Embodiment in conjunction with the drawings, in which:

FIGS. 2 and 3 show two views of one embodiment of a mode control structure made in accordance with the present invention;

FIGS. 15, 16 and 17 represent alternative embodiments of the present invention.

DESCRIPTION OF THE PREFERRED EMBODIMENT

Figure 1:
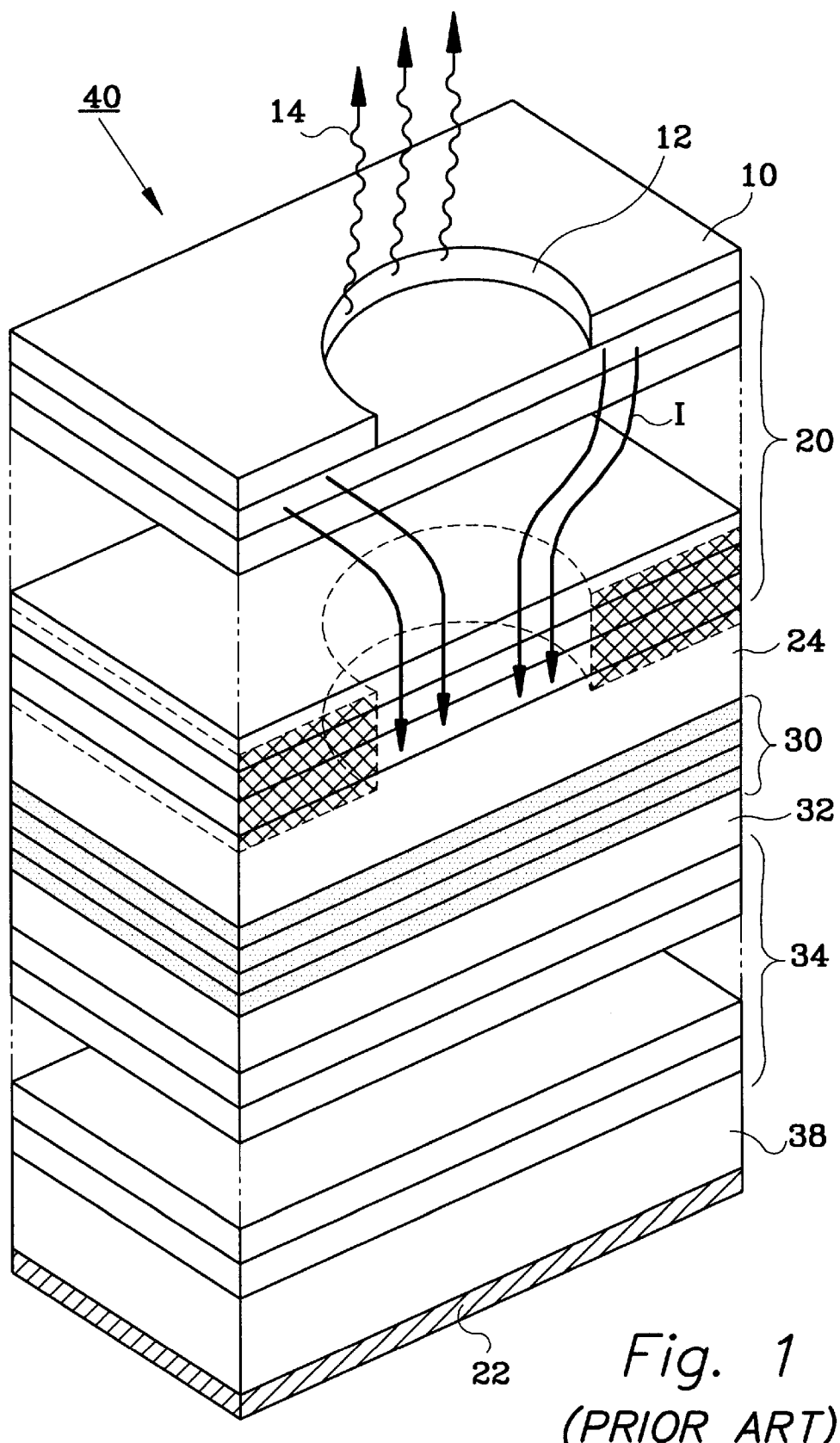
FIG. 1 shows a known structure of a vertical cavity surface emitting laser.

Throughout the Description of the Preferred Embodiment of the present invention, like components will be identified by like reference numerals. In FIG. 1, a cross sectional perspective view of the structure of a typical vertical cavity surface emitting laser is illustrated schematically. At the top of the illustration shown in FIG. 1, a metallic contact layer 10 is provided with an aperture 12 formed through it. The purpose of the aperture 12 is to permit the emission of light 14 through the upper surface of the vertical cavity surface emitting laser, or VCSEL. Below the contact layer is a first mirror stack 20. In a manner that is generally known to those skilled in the art, the first mirror stack 20 can be selectively damaged by various known techniques, such as ion implantation, to create a region of increased resistance surrounding a central region of lower resistance. This creates a preferred electrical path, illustrated by arrows I, along which a current will flow from the contact layer 10 to the contact 22 at the bottom portion of the structure. A top graded index region 24, or upper confinement layer, is provided above a quantum well active region 30. A bottom graded index region 32, or lower confinement layer, is disposed below the active region 30. The amount of grading can vary significantly and the layers can also comprise steps. A second mirror stack 34 is provided below the lower confinement layer and a substrate 38 is disposed between the lower mirror stack 34 and the contact 22. In a manner well known to those skilled in the art, an electrical current can be caused to flow between the upper contact layer 10 and the lower contact layer 22 to electrically pump the laser and cause the laser to lase. The light 14 emitted from the upper surface of the laser will be of a preselected wavelength. The wavelength of light emitted by the laser will be determined by the materials used to provide the numerous layers within the laser structure and the thickness of the various layers, particularly the first and second mirror stacks. The thicknesses of the mirror stack layers, relative to the wavelength of the emitted light, will determine the wavelength of the light 14 emitted from the top layer of the laser. The thicknesses of the mirror stack layers are selected as a function of the desired wavelength of emitted light. These thicknesses must be chosen, in the manner that is well known to those skilled in the art, so that the transmittance and reflectance of the layers within the mirror stacks cooperate to cause the laser to lase.

In FIG. 2, the dashed box represents the majority of the laser structure shown in FIG. 1. It is identified by reference numeral 41 and should be understood to comprise all of the structures shown in FIG. 1 except the metallic contact 10 and the top layer 21 of the upper mirror structure 20. The portions of the laser represented by the dashed lines in FIG. 2 are similar to any one of a number of well known laser structures. On the top of the upper layer 21 of the mirror structure 20 is disposed a mode control structure that comprises first and second portions. The first portions 50 of the mode control structure are shaped to permit and encourage the lasing and emission of light through them. Second portions 52 of the mode control structure are shaped to inhibit the lasing and emission of light through them. The emission of light 14 through the first portions 50 of the mode control structure 60 is represented by the arrows in FIG. 2.

FIG. 3 is a top view of FIG. 2 which shows that the first portion 50 of the mode control structure is formed in an annular shape. The first portion 50 is surrounded by a generally circular second portion 52 of the mode control structure. In addition, the first portion 50 surrounds a generally circular second portion 52 located at the center of the illustration in FIG. 3. Surrounding the mode control structure is the nonoverlapping metallic contact 10. Because the preferred lasing region of the laser is formed in the annular shape of the first portion 50 in FIG. 3, the light from the laser can be initially emitted in a radially symmetric shape. As is well known to those skilled in the art, a laser such as that depicted schematically in FIGS. 1, 2 or 3, can be associated with an optical fiber for the transmission of light through the optical fiber in a communication system. The initial emission of light into the fiber would have the radially symmetric shape discussed above.

Figure 4:
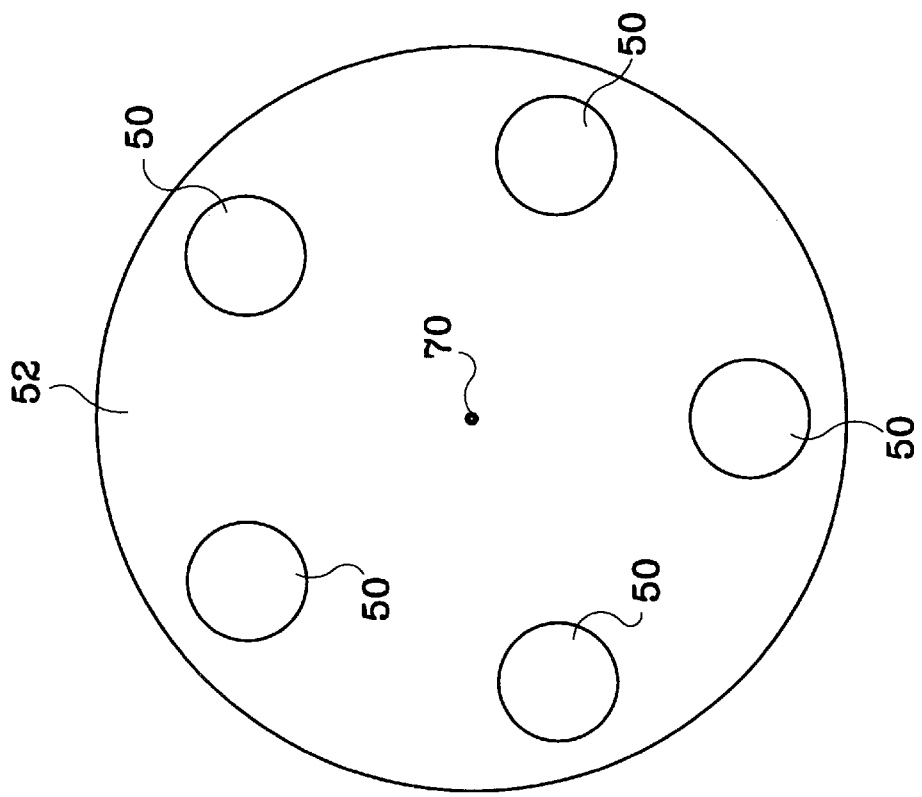

FIG. 4 shows an alternative arrangement of first and second portions of the mode control structure. The first portions 50 are arranged in the shapes of five thicker circular patterns with the remaining surface area of the mode control structure being the thinner second portion 52. When the mode control structure of the laser is configured as shown in FIG. 4, light is initially emitted into the optical fiber as five beams that are radially symmetrical with respect to the center 70 of the mode control structure 60.

Figure 5:
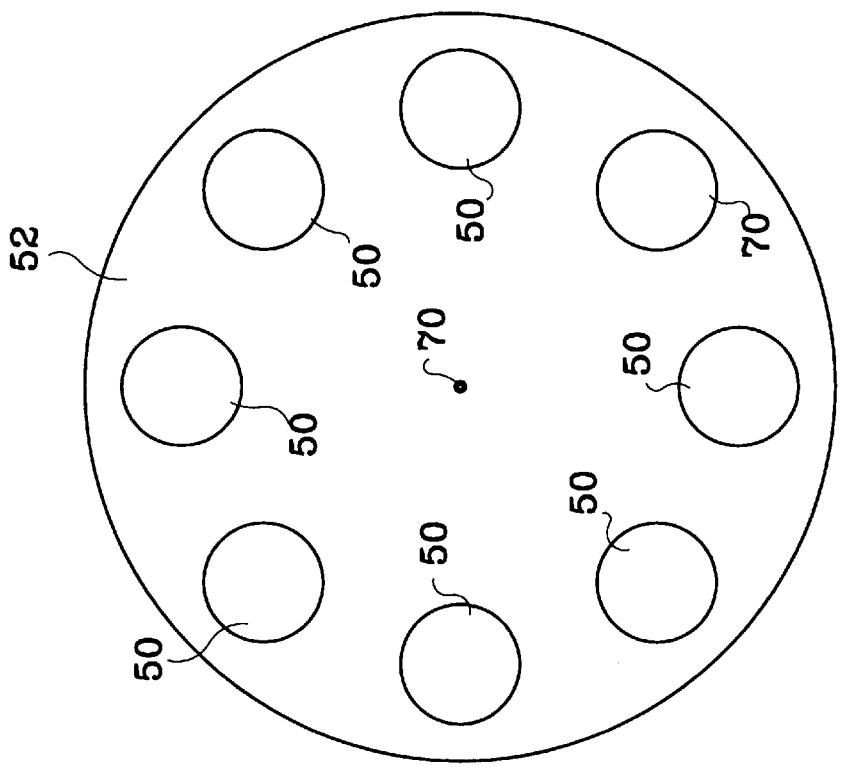
FIGS. 4 and 5 show two alternative patterns for the first and second portions of a mode control structure made in accordance with the present invention.

FIG. 5 shows another alternative embodiment of the present invention. It comprises eight generally circular first portions 50 arranged in a radially symmetrical pattern with respect to the second portion 52 of the mode control structure 60. When associated with an optical fiber, a laser made in accordance with the configuration of FIG. 5 would emit light into the optical fiber as eight individual beams disposed in the pattern shown in FIG. 5. With reference to FIGS. 3, 4 and 5, it can be seen that the mode control structure of the present invention can be shaped in virtually any pattern to determine the relative configurations of the first portions 50 and the second portions 52 of the mode control structure 60. It should also be understood that light is encouraged to lase and is emitted from the thicker first portions 50, but generally inhibited from lasing in the thinner second portions 52 of the mode control structure 60.

Figure 6:
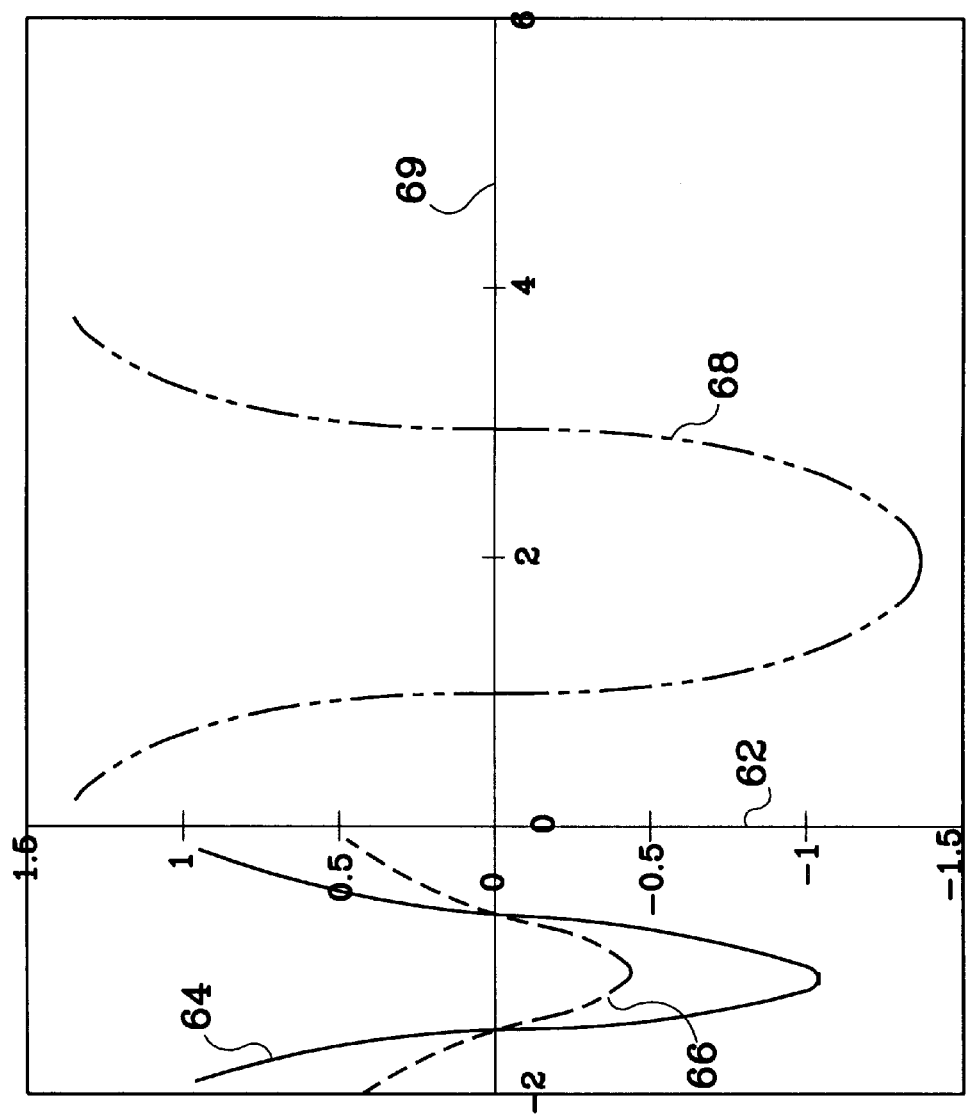
FIG. 6 illustrates one principle of a dielectric reflector.

The basic principles of a dielectric reflector can be understood by understanding the operation and effect of a single dielectric interface. In FIG. 6, the dielectric interface is identified by reference numeral 62. At a dielectric interface 62 with normal incidence, the electric field is continuous. The sum of the fields due to the incident wave 64 and the reflected wave 66 equals the transmitted wave 68. This principle is illustrated in FIG. 6. In the case shown in FIG. 6, the index of refraction is greater in the input media, to the left of the dielectric interface 62, than in the output media to the right of the dielectric interface 62. The result is that the reflected wave 62 exhibits no phase reversal relative to the incident wave 64, but is traveling in the negative direction because of the reflection from the dielectric interface 62. If, on the other hand, the input index in the region to the left of the interface 62 is smaller than the input index in the region to the right of the interface 62, the reflected wave's phase would be reversed with respect to the incident wave 64 and it would be traveling in the negative direction.

Figure 7:
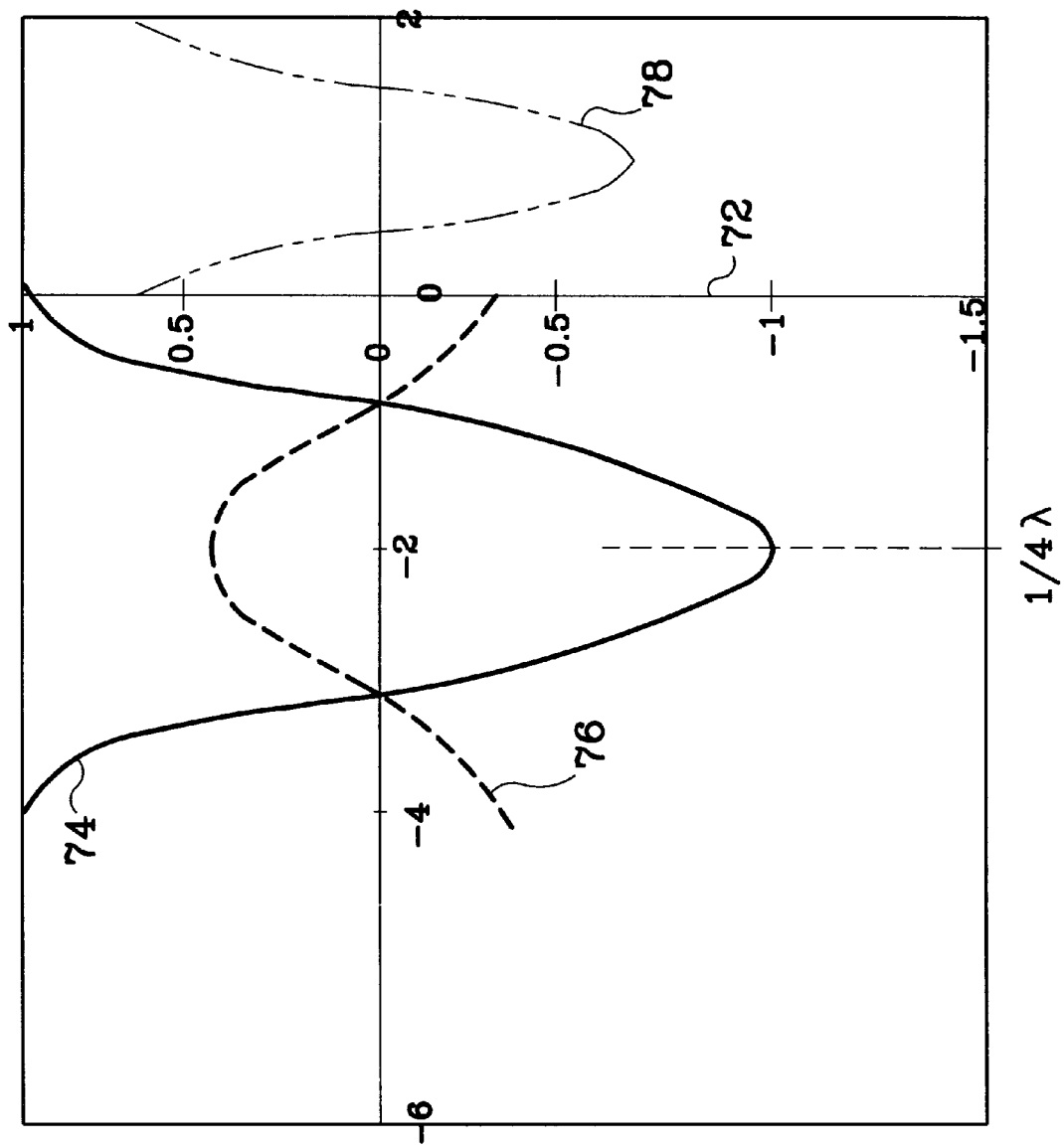
FIG. 7 illustrates an alternative reflection reaction at a dielectric reflector.

A stack of dielectric mirror layers can be used to make a reflector by designing the thicknesses of the layers so that the reflected waves are additive in phase and do not cancel the incident wave. With reference to FIG. 7, if the first interface does not cause a phase reversal, the second interface, which does cause a phase reversal, must be displaced by a quarter wavelength so that it is located at the null point of the electric field. The third interface will then not cause a phase reversal and, therefore, it must be displaced by an integer number of half wavelengths so that the round trip within the laser structure is an integral number of full wavelengths. This is represented in FIG. 7. In FIG. 7, reference numeral 74 represents the incident wave, reference numeral 76 represents the reflected wave and reference numeral 78 represents the transmitted wave. The field on the incident side of the Figure, to the left, is the sum of the reflected and incident waves. They interfere destructively to reduce the intensity of the field. For a mirror having many periods, a null appears in the electric field at this interface, as will be described below in conjunction with FIG. 8. In FIG. 6, reference numeral 64 represents the incident electric field, reference numeral 66 represents the reflected electric field and reference numeral 68 represents the transmitted electric field. In a mirror having many periods, the interface is located at a peak in the electric field because the reflected and incident wave electric fields interfere constructively. This is shown, for example, in FIG. 8 at the boundary of layers 140 and 141. In other words, the peaks appear where there is no phase reversal and the valleys appear where there is a phase reversal because of interference. Reflections come from both surfaces as the light passes through a mirror with minima occurring in the field at the phase reversing interface, making the nonphase reversing interface the dominant reflectance interface. If the interface in FIG. 6 was placed at a quarter wavelength from the interface in FIG. 7 where the position is marked, it should be noted that the reflected waves are in phase and are additive. Therefore, as the light transverses a dielectric stack mirror, a portion of the light is reflected back from each interface. By placing these interfaces a quarter wavelength apart with a period of one half wavelength, the reflected waves all add in phase. In addition, valleys appear at nonphase reversing interfaces and peaks appear at nonface reversing interfaces.

Figure 8:
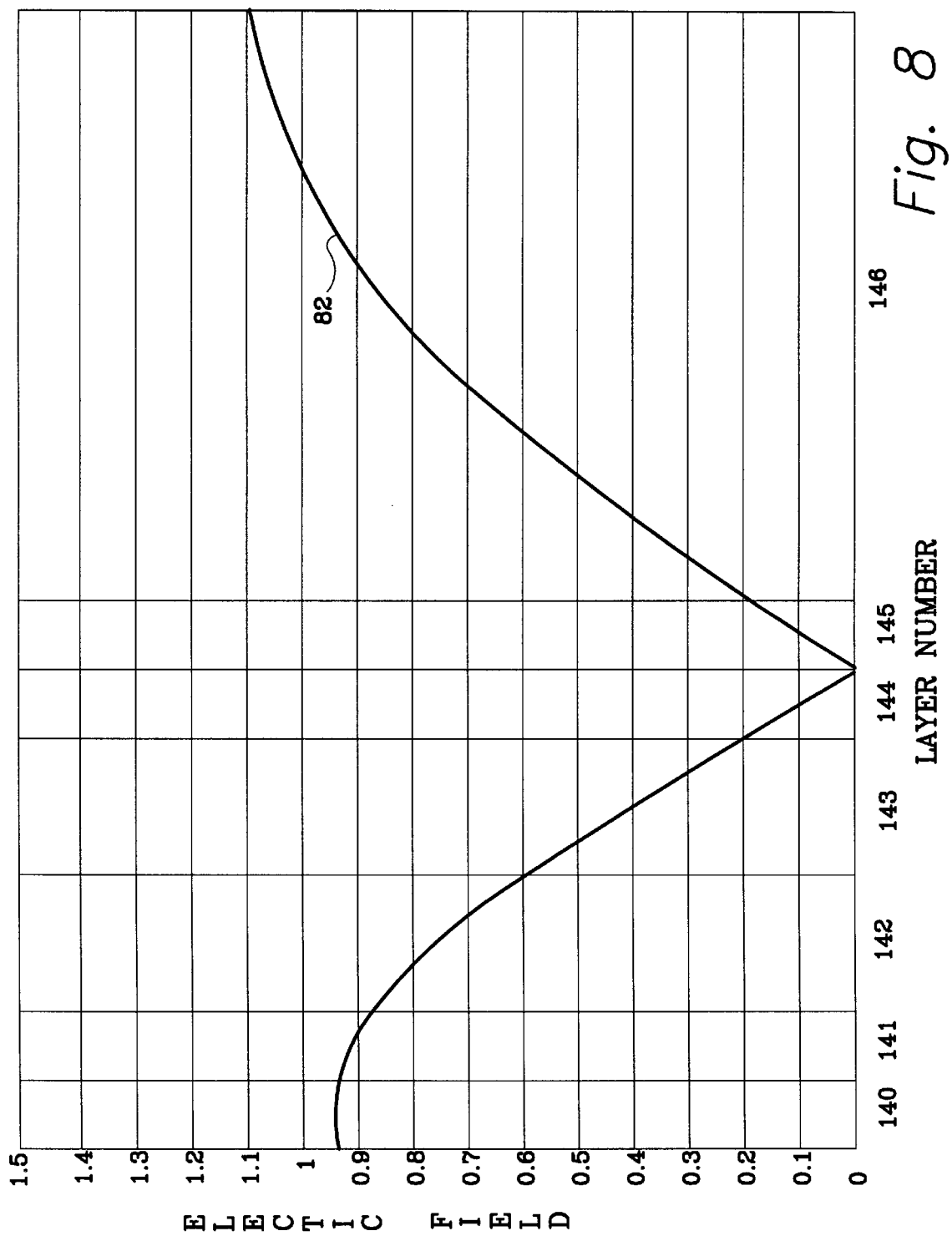
FIG. 8 shows the time-weighted average electric field absolute value in a dielectric stack mirror.

FIG. 8 shows the time-weighted average electric field absolute value in a dielectric stack mirror. The incidence of light is from the right direction in FIG. 8. It should be noted that the position of the null is at the transition from low index of refraction to high index of refraction (i.e. layers 145–144) where a phase reversal occurs. The peaks are located at the high index to low index transition (layers 141–140). Line 82 in FIG. 8 shows the change in the electric field magnitude as a function of position through the thickness of the mirror stack.

Figure 9:
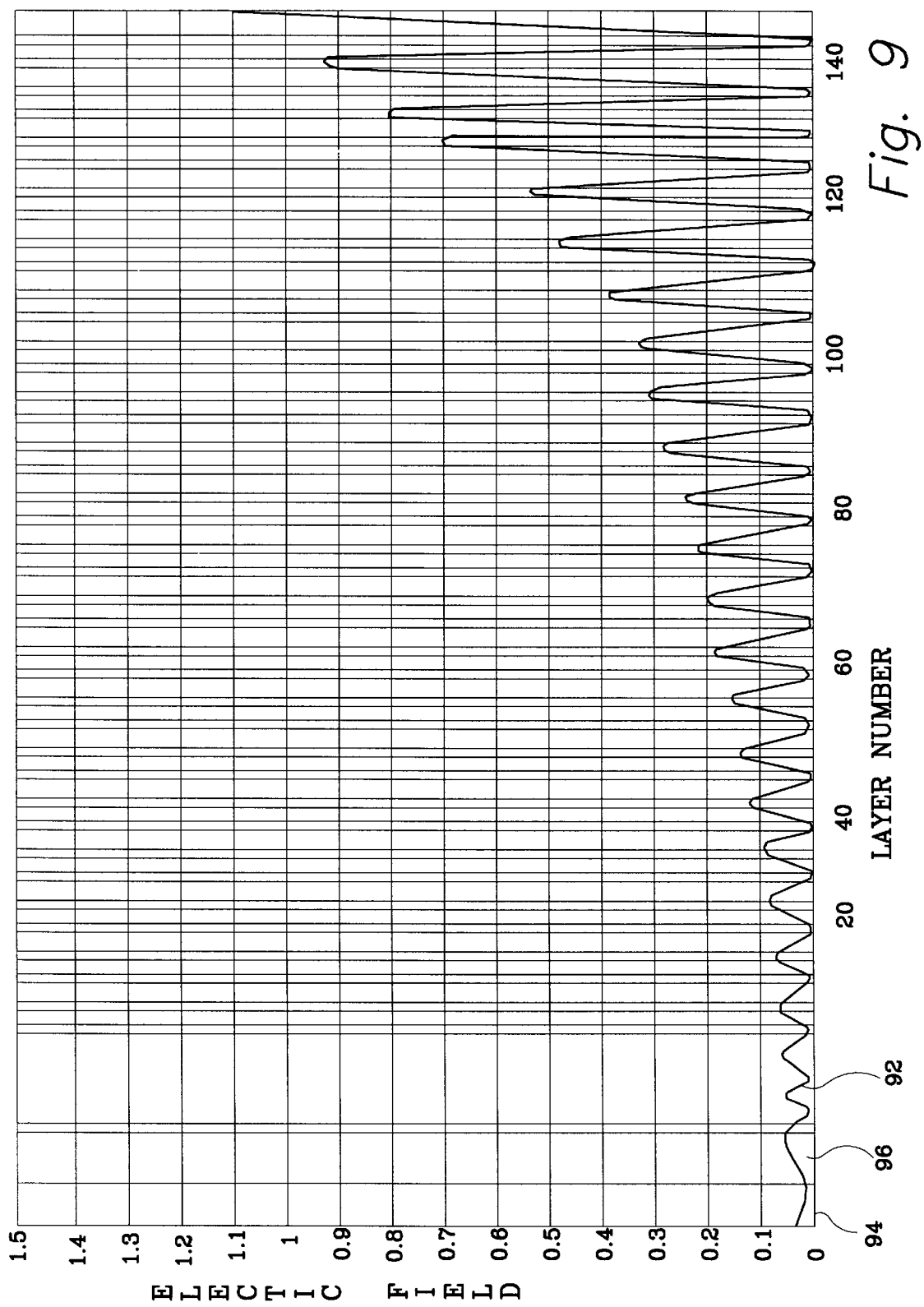
FIG. 9 illustrates the absolute value of the time averaged electric field in a full dielectric mirror.

The absolute value of the time averaged electric field in a full dielectric mirror stack can be seen in FIG. 9. The entrance surface is located at the right side of FIG. 9. The decay, which occurs as the light approaches the left exit surface, is caused because, each time a high-low interface occurs, a small amount of additional light is reflected back with the proper phase. It should be noted that the extra two layers on the left side of the structure are lower index dielectric layers that are added to allow the variation of the reflectivity by varying the two additional layers.

Figure 10:
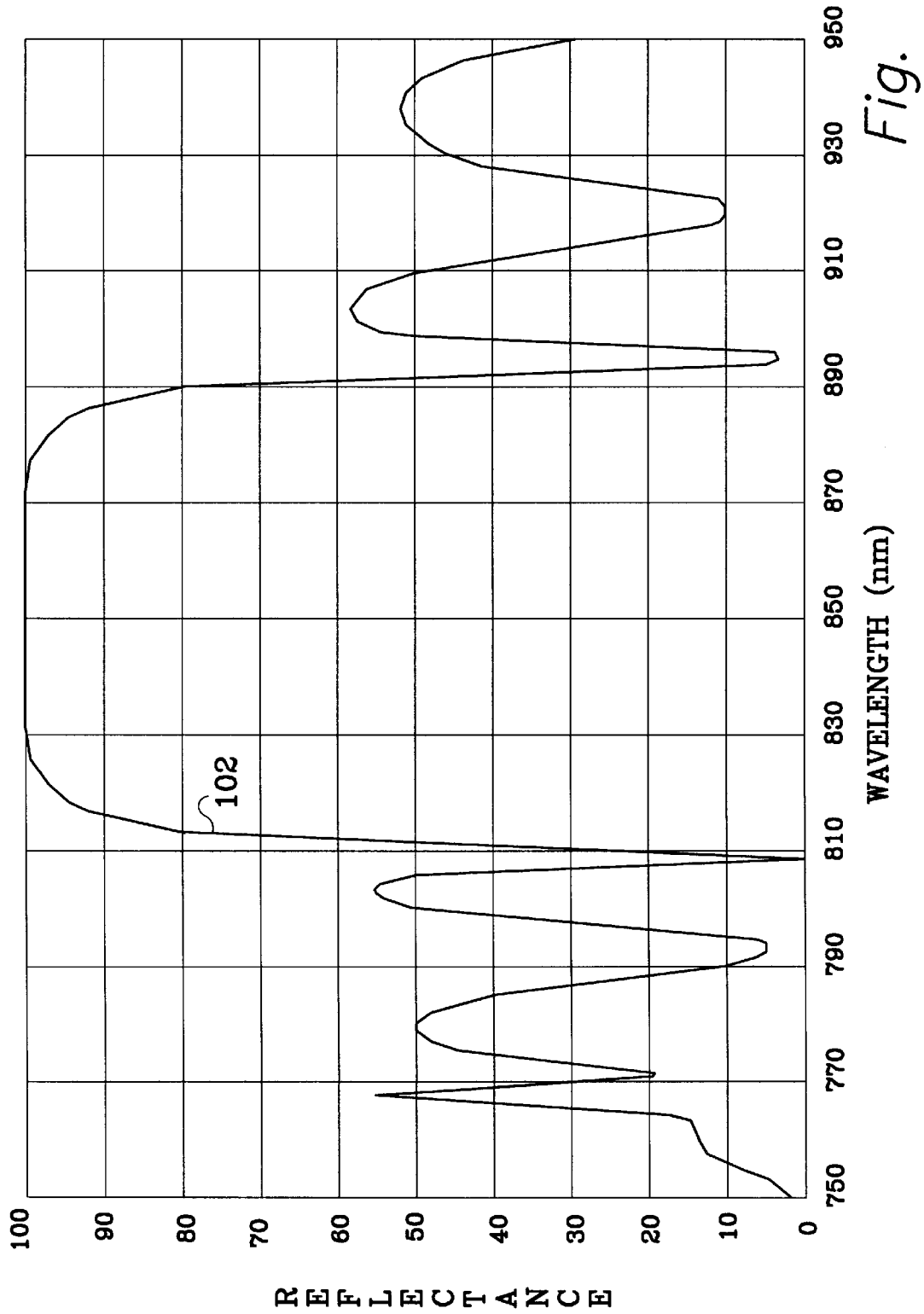
FIG. 10 shows the reflectance within a mirror structure as a function of wavelength.
Figure 11:
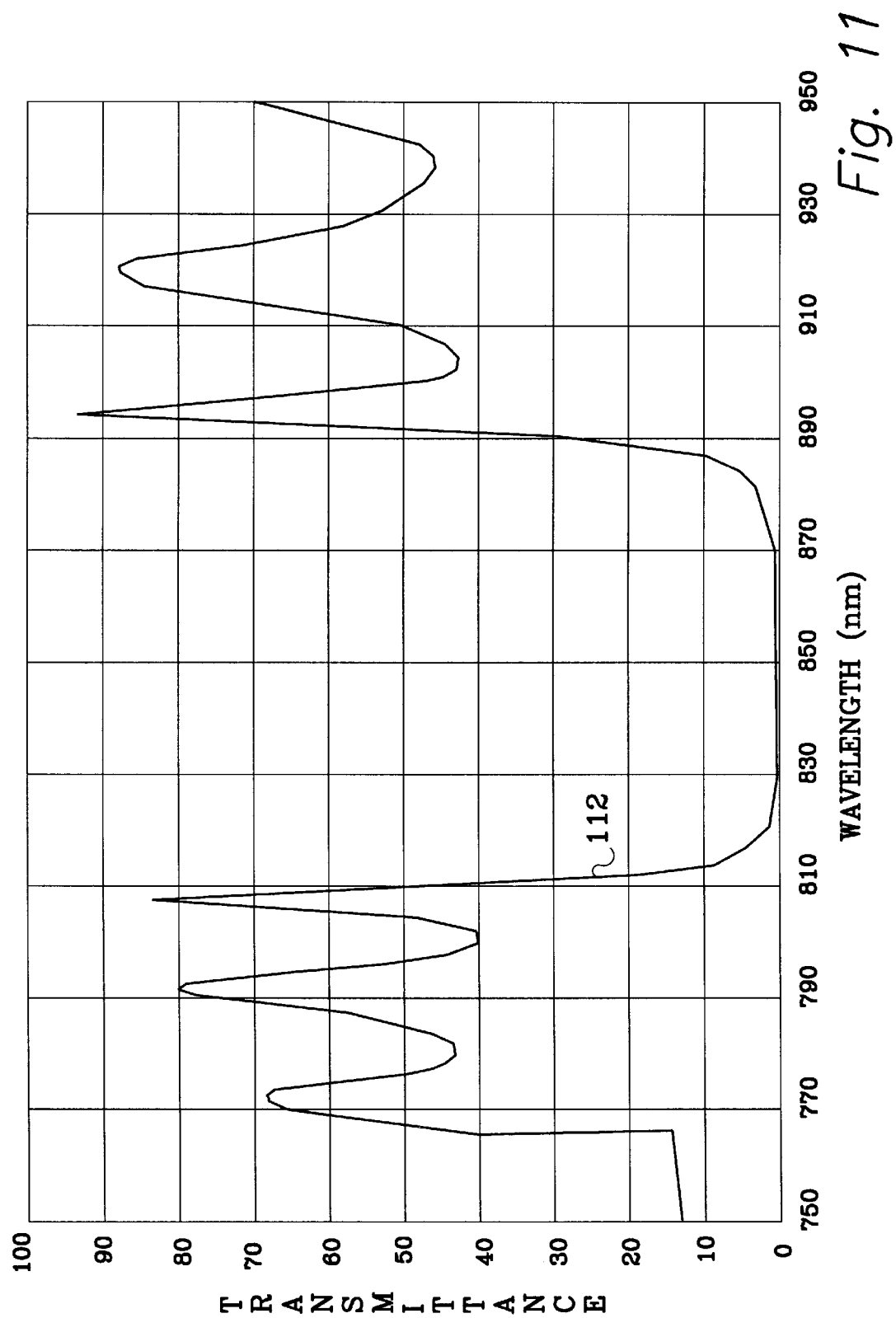
FIG. 11 shows the transmittance within a mirror structure as a function of wavelength.

FIG. 10 shows the reflectance of the structure described above. The magnitude of reflectance, represented by line 102, can be calculated as a function of wavelength. The wavelength variation of this structure is caused by the quarterwave stack being optimal for only one wavelength. This is illustrated in FIG. 10. FIG. 11 shows the transmittance through the ends of the laser. Line 112 represents the transmittance.

Figure 12:
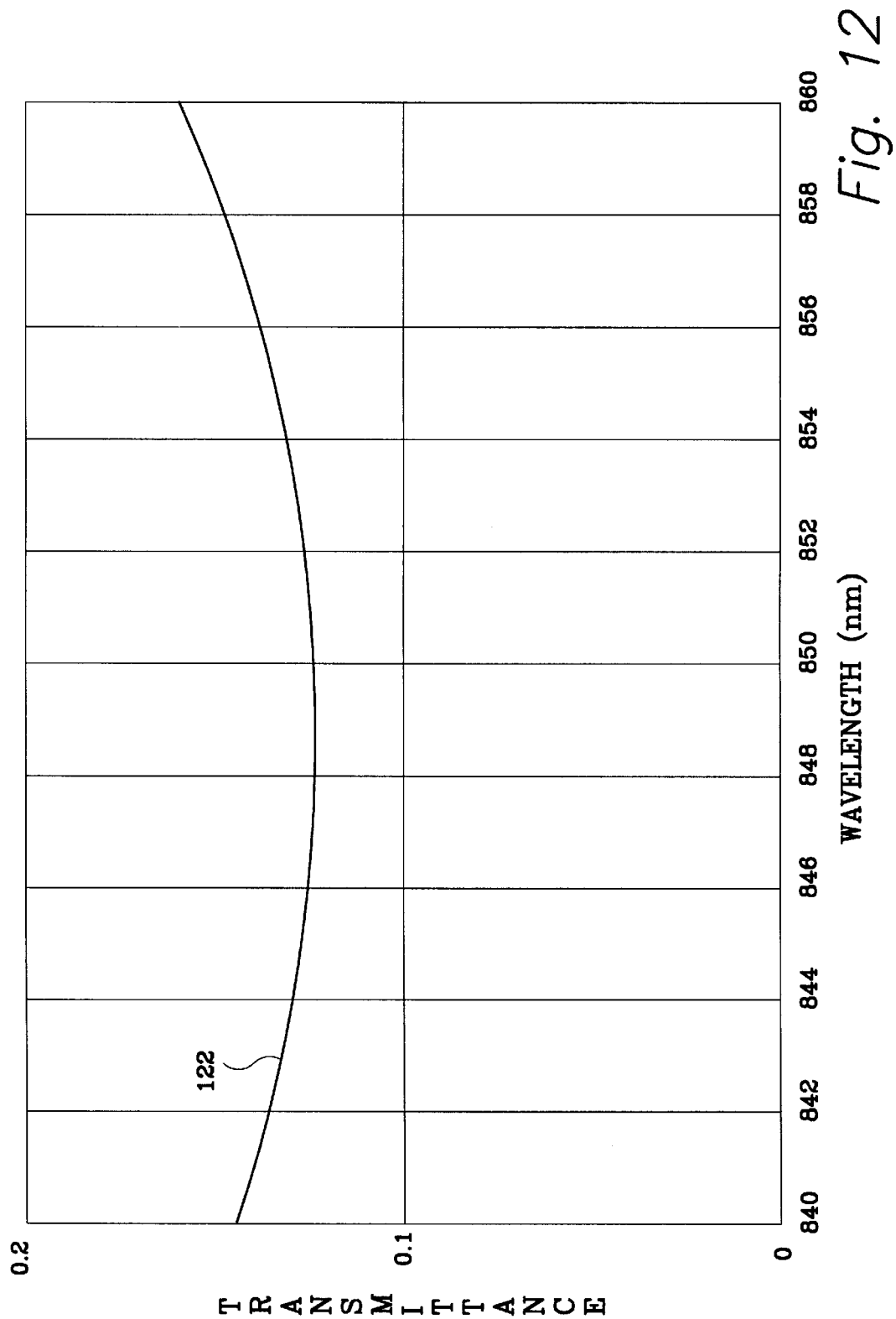
FIGS. 12 and 13 show the transmittance as a function of wavelength for two alternative modifications of the mirror represented in FIG. 9.
Figure 13:
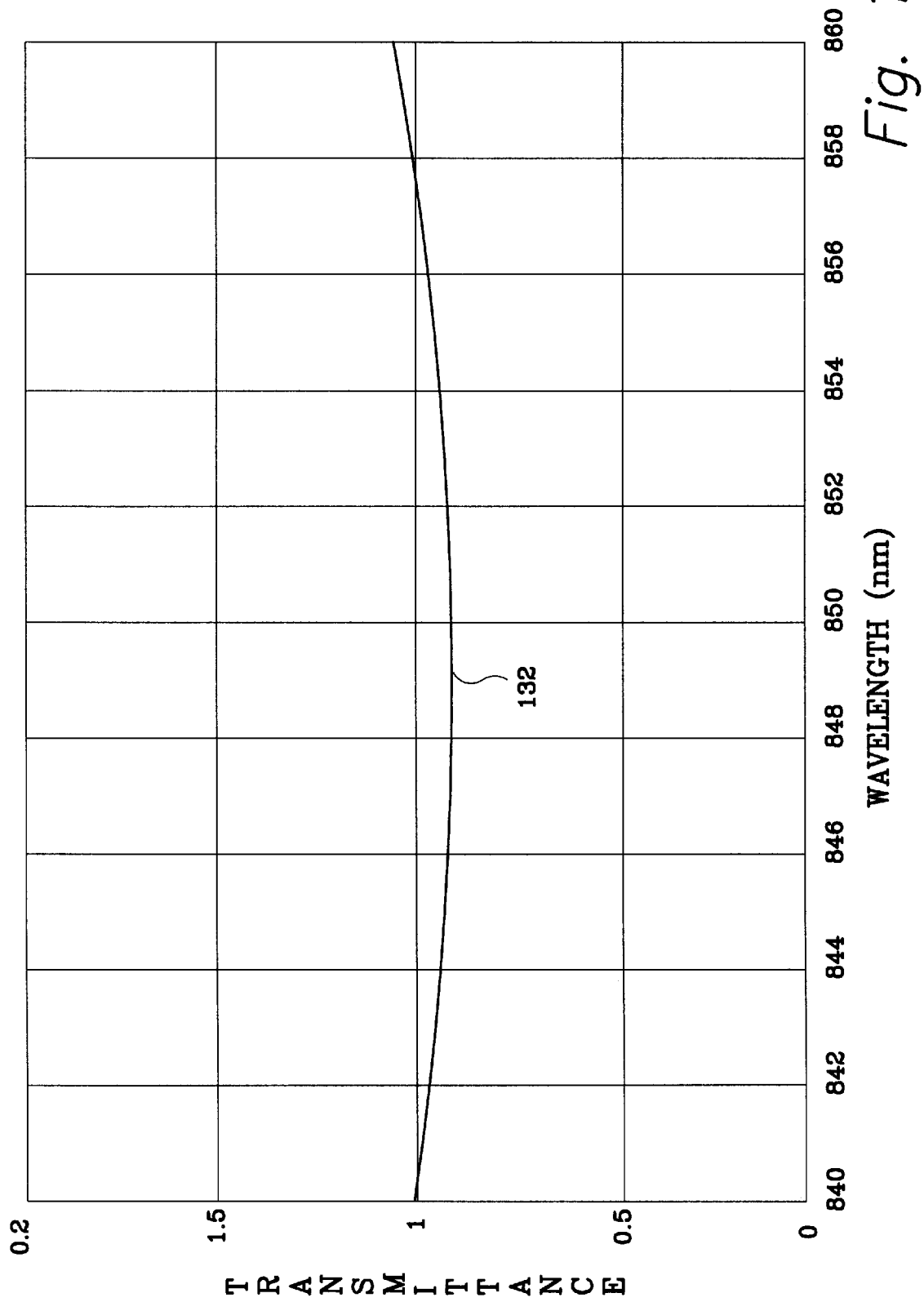

FIG. 12 is an enlarged portion of FIG. 11, showing the region between the wavelengths of 840 nanometers and 860 nanometers. Even though this region represents the lowest transmittance for the mirror, it can be seen that some transmission still exists. Line 122 shows the magnitude of transmittance for the region of FIG. 11 between 840 nanometers and 860 nanometers. The results represented in FIG. 12 can be modified by changing the layers. For example, if the second layer from the left in FIG. 9 is eliminated, the transmission can be significantly increased. This is represented by line 132 in FIG. 13. In a vertical cavity surface emitting laser, the two layers on the left side of FIG. 9 can easily be patterned to have regions of decreased and increased transmittance. FIGS. 12 and 13, show how the inclusion or elimination of the leftmost layers in FIG. 9 can provide decreased transmittance as represented by line 122 in FIG. 12 or increased transmittance as represented by line 132 in FIG. 13. This pattern of the leftmost two layers is used in the preferred embodiment of the present invention to provide first portions of a mode control structure that have increased transmittance, as represented in FIG. 13, and second portions of the mode control structure which have decreased transmittance, as represented by line 122 in FIG. 12.

Figure 14:
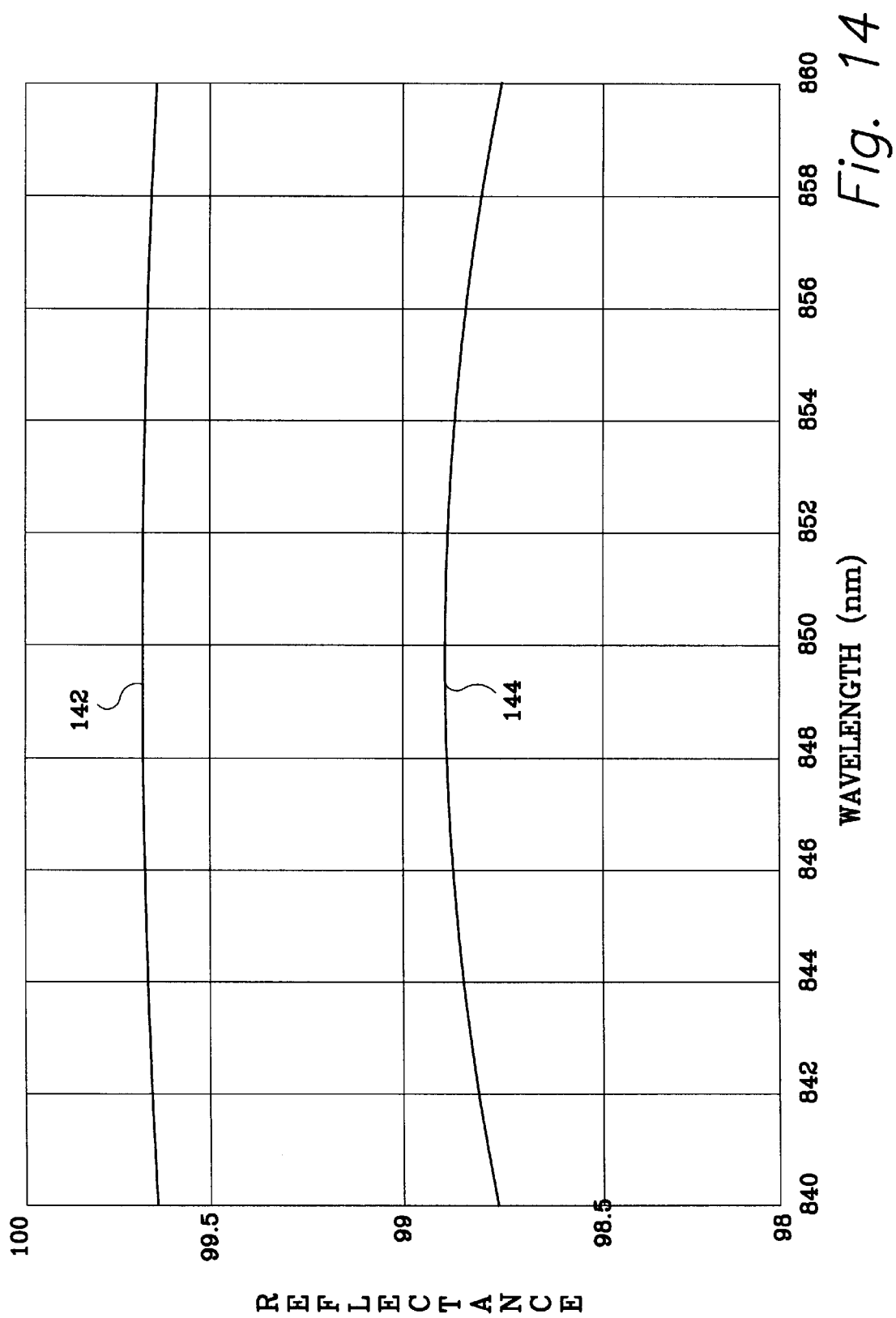
FIG. 14 represents the reflectance for two regions of a mode control structure having different thicknesses.

FIG. 14 represents the reflectance for two regions within a patterned mirror in a vertical cavity surface emitting laser. In order for a laser to lase properly, the round trip gain must equal or exceed the round trip losses for light passing back and fourth between the mirror stacks within the structure of a vertical cavity surface emitting laser. Small changes in reflectance can cause major changes in the gain required for the laser to lase. In the vertical cavity surface emitting laser, the mirror reflectivity can be patterned to give regions which cause lasing and regions which inhibit lasing by not having sufficiently high reflectivity. With reference to FIG. 14, it should be noted that the reflectance of the quarter wave of oxide combined with a quarter wave of nitride, as represented by line 142, is higher than the reflectance with only a quarter wave of nitride, as represented by line 144. It should also be noted that the difference from 100 percent of these two lines does not quite equal the transmittance calculated above in conjunction with FIGS. 12 and 13. This difference is caused by the absorption within the mirror. The light seen by the active region of the VCSEL is reflected light. The difference in reflectivity, from 100 percent, represents the critical quantity because this difference represents the losses from both absorption and transmission. It should be noted that, with reference to FIG. 14, the peak reflectance at the top of curve 142 is approximately 99.7 percent while the peak reflectance of curve 144 is approximately 98.9 percent. With respect to a reflectance of 100 percent, the bottom curve 144 is therefore 3.7 times as "nonreflective" as the top curve 142. This means that there is 3.7 times as much loss for curve 144 as for curve 142. Therefore, the gain in the active region must be 3.7 times as high, assuming perfect bottom mirrors, in order to achieve laser oscillation with the laser structure. The bottom mirrors are not perfect, but they typically are designed to be much more reflective than the top mirrors in a vertical cavity surface emitting laser. Therefore, the approximation of a perfect bottom mirror is not unacceptable. In summary, it should be understood that if a quarter wavelength stack is properly designed, the reflected waves are additive with the correct phase to increase reflectivity each time a period is added. This can be modified by adding or removing full periods or half periods. Through patterning of the mode control structure, the reflectivity can be patterned to create regions within the VCSEL which will lase and others which will not. The lasing regions are referred to herein as the first portions of the mode control structure and the nonlasing regions are referred to herein as the second portions of the mode control structure.

Figure 15:
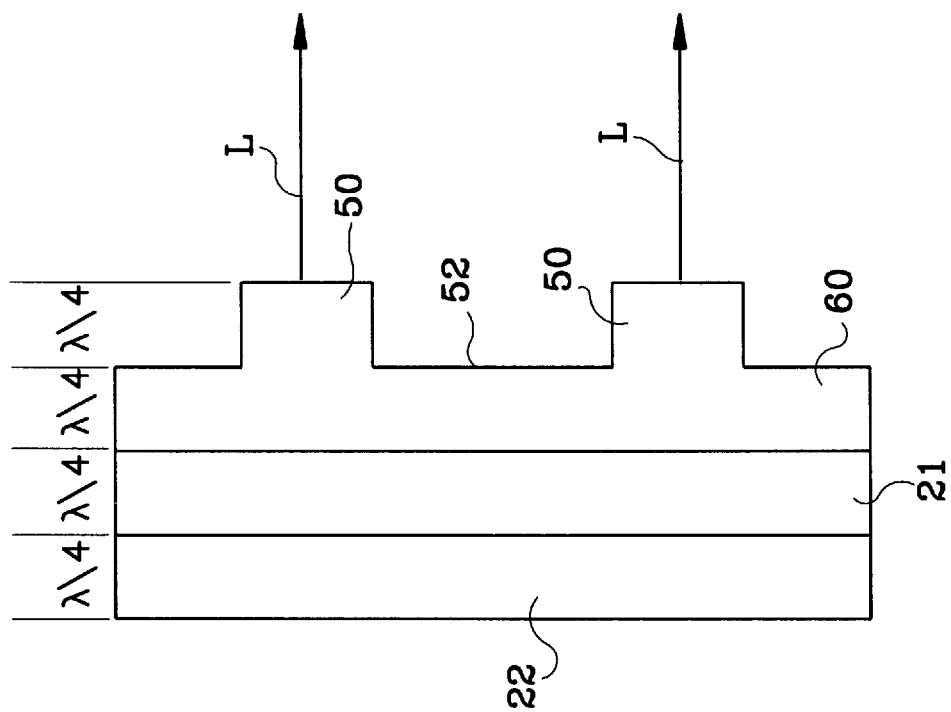

By varying the reflectivity of the upper mirror of a vertical cavity surface emitting laser in a finely patterned way, the filamentation or mode structure can be controlled. There are numerous possible patterns and several possible methods, such as etching, to accomplish this patterning within the scope of the present invention. In one embodiment of the present invention, silicon nitride or silicon dioxide is used on the top surface of the upper mirror and patterned with regions of quarter wavelength and half wavelength thicknesses. The half wavelength regions, or first portions of the mode control structure, will lase in a more preferred manner than the quarter wavelength regions, or second portions, of the mode control structure. In a particularly preferred embodiment of the present invention, the first portion of the mode control structure is annular in shape, or "doughnut" shaped. This particular embodiment is illustrated in FIGS. 2 and 3. The metal contact layer could overlap the mode control structure in certain embodiments of the present invention. This overlapping relationship can reduce the selectivity and is undesirable. In addition, the nitride layer could overlap the metal contact layer. FIG. 15 shows one embodiment of the present invention. The mode control structure 60 comprises a first portion 50 that is equal to a half wavelength in thickness. The second portion 52 of the mode control structure 60 is equal to a quarter wavelength. This creates a preferred lasing region through the first portion 50, as represented by arrows L. The index of refraction of the components identified by reference numerals 50 and 60 must be less than the index of refraction of the component identified by reference numeral 21. In addition, they must be greater than that of the output media which is typically air.

Figure 16:
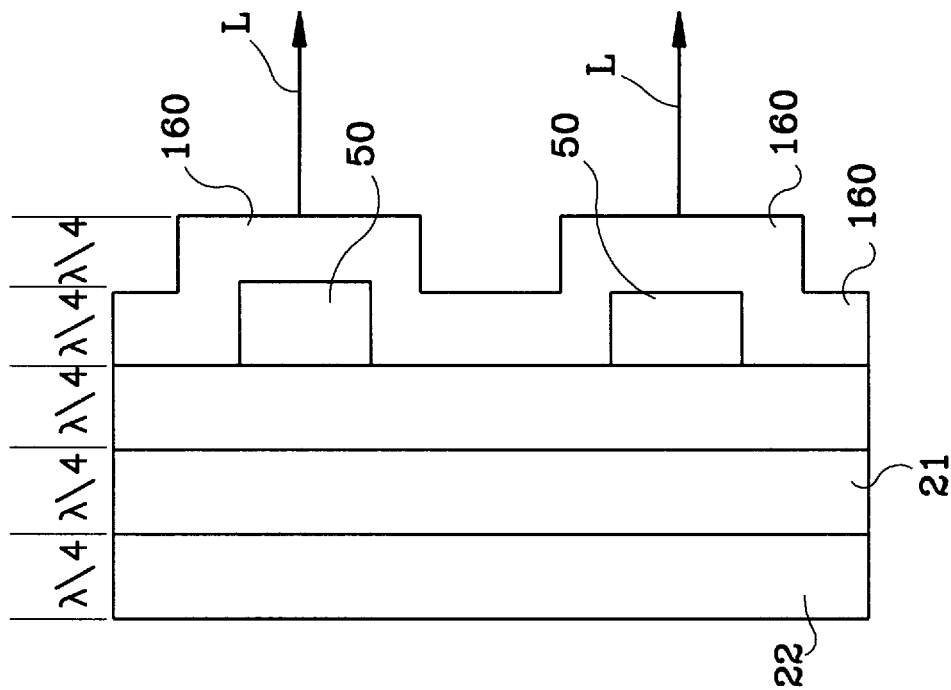

FIG. 16 shows an alternative embodiment of the present invention. The mode control structure comprises a coating 160 over a mode control structure layer 60 that has quarter wavelength regions and half wavelength regions. The quarter wavelength regions 50 define the preferred regions of lasing for the laser. In FIG. 16, the relationships of the indices of refraction for optimal performance should result in component 50 having an index of refraction which is less than that of component 160 but greater than that of the output media. In addition, the index of refraction of component 21 should be greater than the index of refraction of component 50. The regions of the surface that do not have component 50 under then have a quarter wavelength thickness of component 160 over them. This is an antireflection coating that reduces the mirror reflectivity so that laser oscillation is not preferred in this region. The regions of the surface where components 50 and 160 both exist provide additional reflectivity to the mirror and enhance laser oscillation.

FIG. 17 shows an alternative embodiment of the present invention which uses multiple patterned dielectric layers. For example, a quarter wavelength thick layer of silicon dioxide 172 is used for the low reflective region, or second portion 52. An additional quarter wavelength layer of silicon nitride 174 can be disposed selectively on the surface of layer 172 to create regions of higher reflectivity, or first portions 50 of the mode control structure.

In a particularly preferred embodiment of the present invention, multiple dielectric patterning is accomplished by using quarter wavelength layers of higher refractive index material to reduce the reflectivity and quarter wavelength layers of higher refractive index material on top of the lower refractive index material for the higher reflectivity regions, or first portions. In FIG. 17, the index of refraction of component 21 is greater than the index of refraction of component 174. The index of refraction of component 174 is greater than that of component 172. The index of refraction of component 172 is greater than the index of refraction of the output media which is typically air. The basic principle of the structure shown in FIG. 17 is similar to that of FIG. 16. The most desirable of these various alternative structures, if silicon nitride and silicon dioxide are used, is FIG. 16 because the silicon nitride provides a better antireflection coating due to its higher index of refraction than silicon dioxide. However, it should be understood that either structure will work satisfactorily.

The present invention provides a mode control structure for a laser. The mode control structure can comprise two or more thicknesses which are arranged to define a pattern of first portions and second portions of the mode control structure. First portions are provided with a thickness which enhances the lasing of the laser and light is transmitted through the first portions. The second portions are provided with a thickness that inhibits lasing. The emission of light from the patterned first portions of the mode control structure creates a filamentation pattern or modal pattern that is advantageous when the laser is used in signal communication applications.

Although the present invention has been described in terms of a mode control structure incorporated with one of the mirrors of the laser structure, it should be understood that other configurations are also within its scope. Similarly, although the present invention has been described in terms of silicon dioxide and silicon nitride layers, it should be understood that the selection of particular materials is not limiting to the present intention.

The embodiments of the invention in which an exclusive property or right is claimed are defined as follows:

1. A laser, comprising:
   (a) a first mirror stack comprising a first plurality of layers of alternating refractive indices;
   (b) a second mirror stack comprising a second plurality of layers of alternating refractive indices;
   (c) an active region disposed between said first and second mirror stacks, said first mirror stack, said second mirror stack and said active region being selected to cause said laser to emit light of a preselected wavelength
   (d) said first and second mirror stacks each having a first major surface located proximal to said active layer and a second major surface located distal to said active layer; and
   (e) a mode control structure shaped to cause said laser to preferentially emit light through one or more preselected first portions of said mode control structure and inhibit emission of light through second portions of said mode control structure;
   (f) and wherein said mode control structure is located downstream of all said mirror stacks as measured by the direction of light emission;
   g) said first portions of said mode control structure have a thickness generally equal to an integral multiple of a half of said preselected wavelength; and
   h) said second portions of said mode control structure have a thickness generally equal to an integral multiple of half of said preselected wavelength plus a quarter of said preselected wavelength.

2. The laser of claim 1, wherein:
said mode control structure comprises silicon nitride.

3. The laser of claim 1, wherein:
said mode control structure comprises silicon dioxide.

4. The laser of claim 1, further comprising:
a metallic contact layer disposed in nonoverlapping association with said mode control structure.

5. The laser of claim 4, further comprising:
a substrate, said first and second mirror stacks being disposed between said substrate and said metallic contact layer.

6. The laser of claim 1, wherein:
said first and second portions comprise the same material.

7. The laser of claim 1, wherein:
said first portion is radially symmetric with respect to a center of said mode control structure.

8. The laser of claim 1, wherein:
said first and second portions comprise materials of different refractive indices.

9. The laser of claim 1, further comprising:
a coating disposed over said first and second portions of said mode control structure.

10. The laser of claim 9, wherein:
said coating has a thickness generally equal to a quarter of said preselected wavelength.

11. The laser of claim 9, wherein:
said coating comprises silicon nitride and said first portion comprises silicon dioxide.

12. The laser of claim 1, further comprising:
a first confinement layer and a second confinement layer, said active region being disposed between said first and second confinement layers, said first and second confinement layers being disposed between said first and second mirror stacks.

13. The laser of claim 1, wherein:
said laser is a vertical cavity surface emitting laser.

14. The laser of claim 1, wherein:
said first and second portions are patterned in relation to the desired mode of emitted light.

15. The laser of claim 1, wherein:
said first portions are constructed and arranged to emit light in preselected modal patterns.

16. The laser of claim 1, wherein:
the mode control structure is formed from an uppermost layer of the first mirror stack.

17. The laser of claim 1, wherein:
the mode control structure varies the reflectivity of the first mirror stack in a pattern selected to control the mode of emitted light.

18. A laser, comprising:
a first mirror stack comprising a first plurality of layers of alternating refractive indices;
said first mirror stack being a top mirror through which light exits the laser;
a second mirror stack comprising a second plurality of layers of alternating refractive indices;
an active region disposed between said first and second mirror stacks, said first mirror stack, said second mirror stack and said active region being selected to cause said laser to emit light of a preselected wavelength;
a mode control structure shaped to cause said laser to emit light through one or more preselected first portions of said mode control structure and inhibit emission of light through second portions of said mode control structure, said mode control structure being located downstream of all said mirror stacks as measured by the direction of light emission;
said first portions of said mode control structure have a thickness generally equal to a half of said preselected wavelength and said second portions of said mode control structure have a thickness generally equal to a quarter of said preselected wavelength; and said laser being a vertical cavity surface emitting laser.

19. The laser of claim 18, further comprising:

a metallic contact layer disposed in nonoverlapping association with said mode control structure, said mode control structure comprising silicon nitride, or silicon dioxide, or both said first portion is radially symmetric with respect to a center of said mode control structure; and a coating disposed over said first and second portions of said mode control structure, said coating having a thickness generally equal to a half of said preselected wavelength plus a quarter of said preselected wavelength, said coating comprises silicon nitride and said first portion comprise silicon dioxide.

20. The laser of claim 19, further comprising:

a first confinement layer and a second confinement layer, said active region being disposed between said first and second confinement layers, said first and second confinement layers being disposed between said first and second mirror stacks; and a substrate, said first and second mirror stacks being disposed between said substrate and said metallic contact layer.

21. The laser of claim 18; wherein:

said first and second portions are patterned in relation to the desired mode of emitted light.

22. The laser of claim 18, wherein:

said first portions are constructed and arranged to emit light in preselected modal patterns.

23. The laser of claim 18, wherein:

the mode control structure is formed from an uppermost layer of the top mirror.

24. The laser of claim 18, wherein:

the mode control structure varies the reflectivity of the top mirror in a pattern selected to control the mode of emitted light.

25. A laser, comprising:

a first mirror stack comprising a first plurality of layers of alternating refractive indices, said first mirror stack presenting an outermost surface capable of receiving additionally deposited layers;

a second mirror stack comprising a second plurality of layers of alternating refractive indices;

an active region disposed between said first and second mirror stacks, said first mirror stack, said second mirror stack and said active region being selected to cause said laser to emit light of a preselected wavelength;

a mode control layer, said mode control layer being deposited on said outermost surface of the first mirror stack and shaped to cause said laser to emit light through one or more preselected first portions of said mode control layer and inhibit emission of light through second portions of said mode control structure, said laser being a vertical cavity surface emitting laser, said first portions of said mode control layer having a thickness generally equal to an integral multiple of a half of said preselected wavelength plus a quarter of said preselected wavelength and said second portions of said mode control layer have a thickness generally equal to an integral multiple of half of said preselected wavelength, and wherein said mode control structure is located downstream of all said mirror stacks as measured by the direction of light emission;

a metallic contact layer disposed in self aligned association with said mode control layer, said mode control layer comprising silicon nitride or silicon dioxide, or both, said first portion is radially symmetric with respect to a center of said mode control layer;

a coating disposed over said first and second portions of said mode control layer, said coating having a thickness generally equal to an integral multiple of a half of said preselected wavelength plus a quarter of said preselected wavelength, said coating comprises silicon nitride and said first portion comprise silicon dioxide;

a first confinement layer and a second confinement layer, said active region being disposed between said first and second confinement layers, said first and second confinement layers being disposed between said first and second mirror stacks; and a substrate, said first and second mirror stacks being disposed between said substrate and said metallic contact layer.

26. The laser of claim 25, wherein:

said first and second portions are patterned in relation to the desired mode of emitted light.

27. The laser of claim 25, wherein:

said first portion are constructed and arranged to emit light in preselected modal patterns.

28. The laser of claim 25, wherein:

the mode control structure is formed from an uppermost layer of the first mirror stack.

29. The laser of claim 25, wherein:

the mode control structure varies the reflectivity of the first mirror stack in a pattern selected to control the mode of emitted light.

* * * * *